(12) United States Patent
Milkovic et al.

(10) Patent No.: US 6,518,772 B1
(45) Date of Patent: Feb. 11, 2003

(54) METHOD AND DEVICE FOR THE DETECTION OF DAMAGE IN THE INSULATION OF ELECTRICAL COMPONENTS, PARTICULARLY OF LINES AND CABLE HARNESSES

(75) Inventors: Nikola Milkovic, Wertheim (DE); Josef Hanson, Bad Camberg (DE)

(73) Assignee: Wee-Electrotest Engineering GmbH, Wertheim (DE)

( * ) Notice: Subject to any disclaimer, the term of this patent is extended or adjusted under 35 U.S.C. 154(b) by 0 days.

(21) Appl. No.: 09/698,264

(22) Filed: Oct. 30, 2000

(51) Int. Cl.[7] .......................... H01H 31/12; H01H 9/50
(52) U.S. Cl. ........................ 324/551; 324/536
(58) Field of Search ................... 324/551, 514, 324/539, 541, 543, 544, 536

(56) References Cited

U.S. PATENT DOCUMENTS 6,181,139 B1 * 1/2001 Joergensen et al. ......... 324/455
6,333,715 B1 * 12/2001 Kato et al. .................. 324/536

FOREIGN PATENT DOCUMENTS

| DE | 2801649 C3 | 4/1979 |
| DE | 3309658 C2 | 9/1984 |
| EP | 0335351 B1 | 10/1989 |

\* cited by examiner

*Primary Examiner*—Christine Oda
*Assistant Examiner*—J Kerveros
(74) *Attorney, Agent, or Firm*—Birch, Stewart, Kolasch & Birch, LLP

(57) ABSTRACT

By a test vessel, a test enclosure is created immediately surrounding the zone of the line or cable harness to be inspected by detection. This enclosure is sealed off before detection-inspection and an internal atmosphere is substituted by at least a partial gas substitution with a test gas or a test gas mixture with a lower disruptive discharge voltage than that of air. This test method permits detection of faulty lines with greater distances between the faulty line, the test electrode, and the corresponding counter-electrode. A corresponding pliers-type device for the sectional detection of a line or harness, or a stationary vacuum seal-tight testing chamber capable of performing the same detection may be used. The method is suitable also for a local detection when the test vessel is created and formed by the installation object itself (e.g., an aircraft fuselage).

16 Claims, 4 Drawing Sheets

METHOD AND DEVICE FOR THE DETECTION OF DAMAGE IN THE INSULATION OF ELECTRICAL COMPONENTS, PARTICULARLY OF LINES AND CABLE HARNESSES

BACKGROUND OF THE INVENTION

1. Field of the Invention

The invention concerns a method and a related device for the detection of damage in the insulation of electrical components, particularly of lines and cable harnesses. The detection is effected by applying a voltage between at least one supply lead of an electrical structural element or a conductor of a line and an external counter-electrode or a further conductor of the structural element and/or of the cable harness, and pre-discharges or discharges are detected electrically, optically, acoustically and/or chemically.

Electric lines consist of a conductor and an insulation and can, as required, be provided with an enclosure, a shield and a jacket. The conductor is the conducting component of an electric line. The protective enclosure (wrapping) of a line improves the mechanical resistance or the stability against liquids. A shield is a conductive wrapping of the line for the purpose of reducing electrostatic or electromagnet disturbances. A jacket is the outer enclosure of one or more shielded or non-shielded lines.

For service in vehicles, electrical plants and equipment, lines can assembled to a prefabricated cable harness. Cable harnesses are individually made line bundles, equipped with plugs, such bundles being made from several lines mainly by hand. Depending on the application, these are provided with a wrapping for protection against physical or chemical influences.

High requirements are demanded from cable harnesses with regard to their reliability. This applies in particular for applications in aviation and aerospace. The electrical network system in aircraft and spacecraft consists of power sources, consumers, safety equipment and cable harnesses. The latter serve as the connections of the consumers with the generators of electric power and they serve the purpose of conductive transmission of electric signals.

The number of required electric circuits of electrical network systems is high, in which case a high packing density is necessary in each individual bundle. Modem insulation materials, specially developed for aviation and aerospace applications, allow extremely thin insulation layer thicknesses. However, these are very sensitive to mechanical influences. In order to avoid faults in the insulation as well as a resulting failure of the insulating ability, the manufacture of the lines is performed on a high quality level. Non-homogeneities in the structural build-up, cracks, crushes/bruises, scraping/grazing of the insulation, which are often attributable to lack of care during pre-assembly and installation of the cable harnesses, are unacceptable and are not to be allowed.

2. Description of the Related Art

In order to achieve a high level of reliability of the applied cable harnesses, safety analyses (production tests) are carried out even during the fabrication phase of the cable harness. In order to recognise dangerous weak points resulting from assembly-related faults in the cable harnesses at individual lines, comparatively high test voltages are required in this case. In order to avoid damage to any electrical or electronic structural elements possibly installed in the cabling, or to any utilities connected to the line system and which are partially highly sensitive to overvoltage, the energy input at the test object must be, however, limited. This restricts the applicability of previously known test methods. The applied test voltages have only a short effect time in order to avoid pre-discharges in non-critical zones and a limited amplitude, so that a flashover can only take place at a weak point (testing according to DIN EN 2283; Edition: 1996-03, Aviation and Aerospace; testing of cabling of aircraft; identical with the European standard EN 2283: 1996). For this reason and in this manner, only certain faulty arrangements can be detected with not too large a distance between the faulty line, the test electrode and the corresponding counter-electrode.

With a local test, meaning, a test of a line or a cable harness in an installed condition after repair, maintenance or alteration to the installed object in which a cable harness is laid, another fact to be considered is that one is restricted in any event with regard to the applied test voltage.

In other cases there are no lines or cable harnesses to be tested but, instead, individual structural elements, especially such which react sensitively to overvoltages or which are arranged in critical areas. It would therefore, for example, be desirable to be able to inspect electric sensors installed in fuel tanks for their filling level monitoring under local conditions with regard to their voltage endurance.

The discharge functions observed here for the purpose of determining a fault in the insulation are based on the effect of gas discharges so that the necessary disruptive discharge voltage $U_d$ is dependent on the product of the electrode distance a and the pressure p of the prevailing gas atmosphere. As the latter influence variable, however, is extensively constant due to the ambient air and the atmospheric pressure, $U_d \sim a$ applies in the area which is relevant here. $U_d$, as mentioned above, is limited. For this reason, the concept of "out-testing" of faulty insulation fails with an unfavorable location of the fault, e.g., on the side facing away from the counter-electrode, so that no reliable measurement-technical detection of such weak points has been possible up to the present.

SUMMARY OF THE INVENTION

The invention is based on the task assignment of stating a method and a device with which, while using a minimum of electric energy, a non-destructive testing is made possible for the purpose of detecting assembly-related or operationally related weak points in the insulation of individual structural elements, separate lines or lines within a cable harness.

In accordance with the invention, the problem is solved by the characteristics of the claims 1, 11 and 12. Purposeful developments are the subject-matter of the Subclaims.

The invention is based on the principle of complete or partial substitution of the gaseous dielectric air in the zone of the test object with a testing gas having a reduced disruptive discharge voltage compared with air. By means of gas admixtures (e.g., inert gases such as helium, argon) to the main gas (air) or its complete substitution, the volume ionisation already begins at lowered field strength.

Compared with pure air, a larger number of charge carriers occurs at the same voltage. Even at comparatively smaller test voltages, this assists an increased current flow, by means of which a reduction of the disruptive discharge voltage $U_d$ is achieved. This principle is applied for the "low-level-energy" determination of an insulation fault. For this purpose, for example, the increased current flow during the inception discharge or the early intrusion of the test voltage, e.g. in the zone of its maximum, can be evaluated.

A test according to the method, where a cable harness is concerned, refers to various phases in its life cycle:

(a) after manufacture of the line bundle before installation into the installation object;

(b) after installation of the line bundle into the installation object;

(c) after repair, maintenance or alteration at the line bundle or at the installation object.

The solution according to the invention allows the reduction of the test voltage (direct or alternating voltage) as required for the fault recognition, so that:

unfavorable fault configurations can also be detected with a comparatively low voltage amplitude, the energy required for the discharges at the fault location can be reduced, a danger of overvoltages at voltage-sensitive components, if any, can be avoided, as a result of the reduced discharge energy at the fault location, the danger of damage to neighboring "healthy" insulations is reduced, to an increasing extent, the performance of subjective visual inspectional tests according to DIN EN 3475-201, Edition: 1993-02 (aviation and aerospace; electric lines for aircraft—test method, part 201: visual inspection of the test objects) can be waived in favor of an objective measurement-technical detection of faulty locations in the insulation where, subsequently, the reliability can be considerably increased.

In order to carry out electric discharge functions on the conductor or shield, faultily "exposed" as a result of damage to the insulation or the jacket, the ambient air normally existing between the test electrode and counter-electrode is displaced or substituted by a test gas with a lower disruptive discharge voltage. Inert gases are suitable for this purpose. An economical solution can be achieved here by means of, for example, the use of helium or the cheaper impure helium ("balloon gas", approx. 98 vol.-% He).

For reproducible discharge functions in gases, these must indicate a defined density and composition. For carrying out a test, therefore, either an enclosed test vessel or a device is necessary which allows, for this purpose, comparative conditions at the location to be tested on the line bundle. In this case, both a mobile as well as a stationary device can be applied. If necessary, the test vessel can itself be formed by the installation object in which the line or the cable harness is laid. If the installation object as such cannot be enclosed hermetically, as in the case of e.g. an aircraft fuselage, then it must be hermetically closed off before a test by means of an external enveloping enclosure.

With the reduction of the disruptive discharge voltage by means of a non-ignitable test gas, "critical atmospheres" can also be simulated in this way as they occur, for example, during the normal operating condition in an enclosed fuel tank where, with the reduction of the fuel supply in the tank itself, hollow spaces are formed with an explosive fuel—air mixture which has a reduced disruptive discharge voltage compared with air. In this way, it is possible to test sensors in fuel tanks which are sensitive to overvoltages, e.g., sensors for filling level monitoring, with regard to their voltage endurance at reduced disruptive strength of the surrounding (ambient) atmosphere.

For the purpose of out-testing of faulty locations in the faulty insulation or on the jacket in a line bundle, the following testing steps and testing conditions are necessary:

The corresponding conductor or shield is to be contacted with one side of the testing source. It represents the test electrode (test condition).

The counter-electrode is either part of the test object or part of the test vessel (device) and, with opposite poling to the conductor or shield, is to be connected to the test source (test condition).

Substitution of the atmospheric air by the test gas (test condition).

Connect-up of the test source and raising the test voltage to a specified limit value or for such a period of time until, by means of inception discharge functions, a weak point is found in the insulation (test condition).

Localisation of the fault by means of detectable signals (optical, electrical, chemical or acoustical signals).

Marking the faulty location in the cable harness.

Switching off the test voltage.

Substitution of the test gas with atmospheric air.

Depending on the geometry of the cable harness to be tested and depending on the moment of time, with reference to the various phases in the life cycle of a cable harness, differentiation is necessary in principle between the various testing configurations:

1. The cable harness (test object) is installed in a fixed-location in an installation object (aircraft, automobile, . . . ). It is therefore stationary but freely accessible:

A test can be performed with a mobile device where this is moved along the test object.

2. The cable harness (test object) is independent of the installation object and can be positioned at random. It is therefore not stationary and freely accessible:

A test can be performed with a mobile device where the test object is led through this.

A test can also be performed with a stationary device.

3. The cable harness (test object) is dependent on the installation object. It is therefore stationary and not freely accessible:

A test can be performed with a hermetic enclosure of the installation object in this itself.

The cable harness, according to a first (mobile) variant, is encircled by a "test pliers" in a locally limited zone. This zone corresponds to the effective testing zone of the test pliers. The test pliers only covers a small part of the test object. For this reason, the pliers must be led along the test object under testing conditions. The test object can be contacted in such a way that this is only "test electrode" or also part of the counter-electrode. In this case, the following testing sequences are possible:

Stepwise coverage of the test object (effective testing zone). With each step, the test voltage is increased evenly up to a pre-specified maximum or up to a fault detection, insofar as this occurs before reaching the maximum.

At constant test voltage, the test pliers is moved along the text object axis at a low and uniform speed.

For reasons of purpose, the test pliers has the following design characteristics:

Inlet and outlet nozzle for the test gas.

The test pliers can be executed as a counter-electrode

The counter-electrode is laminated for practical purposes (e.g., with conductive, flexible plastic lamellas) so that the hollow space normally between the counter-electrode and the test object surface is electrically short-circuited. In this way, test objects with different cross-sections can be tested without electrical loading of the hollow space.

The test pliers is sealed off on the sides in such a way that the test gas is held on the inside at a slight overpressure, or can flow through the interior of the test pliers, respectively.

According to a second (stationary) variant, the cable harness is located in a vacuum seal-tight testing chamber. The test object can be contacted in such a way that this is both a part of the test electrode as well as being a part of the counter-electrode. Taking the testing conditions into due consideration, the following test sequences are possible:

At constant test voltage the test chamber, which is evacuated beforehand, is filled with test gas up to the point of fault detection, or until the envisaged internal pressure is reached.

At pre-specified testing atmosphere (gas mixture, pressure), the test voltage is increased evenly up to the pre-specified maximum or a fault detection.

For practical purposes, the test chamber has the following design characteristics:

The test chamber can be part of the counter-electrode.

For reasons of purpose, there are at least two vacuum seal-tight test chambers which are used alternatingly so that efficient testing is possible.

Electric lead-in and an acryl glass disk for observation purposes.

Vacuum pump stand, test gas connection.

An efficient test is achieved in such a way that the test gas after completion of the test in the first test chamber is suctioned off into the second test chamber containing a test object and then evacuated, and vice versa.

In a further variant of the method, the test vessel is formed either completely or partially by the installation object itself. In this way the voltage endurance of a cable harness itself can be checked and also, in a further step, structural elements (e.g., sensors for filling level monitoring in fuel tanks) connected up to the cable harness and sensitive to overvoltage. A fixed-location installed cable harness is contacted in such a way that this is part of the test electrode as well as being part of the counter-electrode. Taking the test conditions into due consideration, the following test sequence is possible:

The test vessel (installation object or surrounding enclosure, respectively) is open in the downward direction. The atmospheric air is displaced by the incoming light test gas. If the required test atmosphere (gas mixture) is generated, the test voltage is switched on. The test voltage is uniformly increased up to the maximum or up to a fault detection.

The test device has the following design characteristics:

The installation object (e.g., an aircraft fuselage) is a hermetic system. For a non-hermetic installation object, this is additionally located in a hermetic enclosure, such as a sealable foil enclosure.

Connection for test gas (inlet and suctioning-off, respectively)

Connection for air outlet (venting and exhaust)

In the event of large volumes of the installation object, additional displacement bodies can be located in the installation object so that the effective volume of the test vessel is reduced as a result. This can be, for example, an inflatable balloon filled with normal air which adapts itself to the internal contour of the installation object. In this way, the volume of the required test gas is minimised.

Where the facilities/devices are concerned, the test gas conducted through the test device during the test with a minor overpressure (gauge) can be collected in a suitable vessel. After appropriate treatment it can be led back again to the test cycle.

If necessary and if required by the circumstances, e.g. in the case of the use of a test chamber, the work can be performed at a pressure less than the atmospheric pressure. With an unchanged conductor distance, the disruptive discharge voltage $U_d$ according to the Paschen's law, and as a factor of the pressure, reaches a minimum. Therefore, the most favorable working point would be achieved when working in the range of the respective pressure minimum, depending on the type of test gas applied.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE DRAWINGS

The present invention will become more fully understood from the detailed description given hereinbelow and the accompanying drawings which are given by way of illustration only, and thus are not limitative of the present invention, and wherein:

FIG. 1 shows a test pliers with which a mobile detection is made possible. Two casing flanks 2, 3 are spring-connected with one another by means of a hinge joint 4. The casing flank 2 is provided with a gas outlet 6; the casing flank 3 is provided with a gas inlet 5.

Into the test pliers 1, a cable harness 7 is placed whose conductor is connected with a pole of the test voltage source, the negative pole in this case. The counter-electrode electrode is established by conductive casing internal walls 8, 9 and, connected with the latter, flexible and conductive lamellas 10, e.g., made of conductive plastic material, rubber or metal which rest on the outer jacket of the cable harness 7 and, in this way, bridge over the internal space of the test pliers 1. The gas flow is indicated by arrows.

Figure 1:
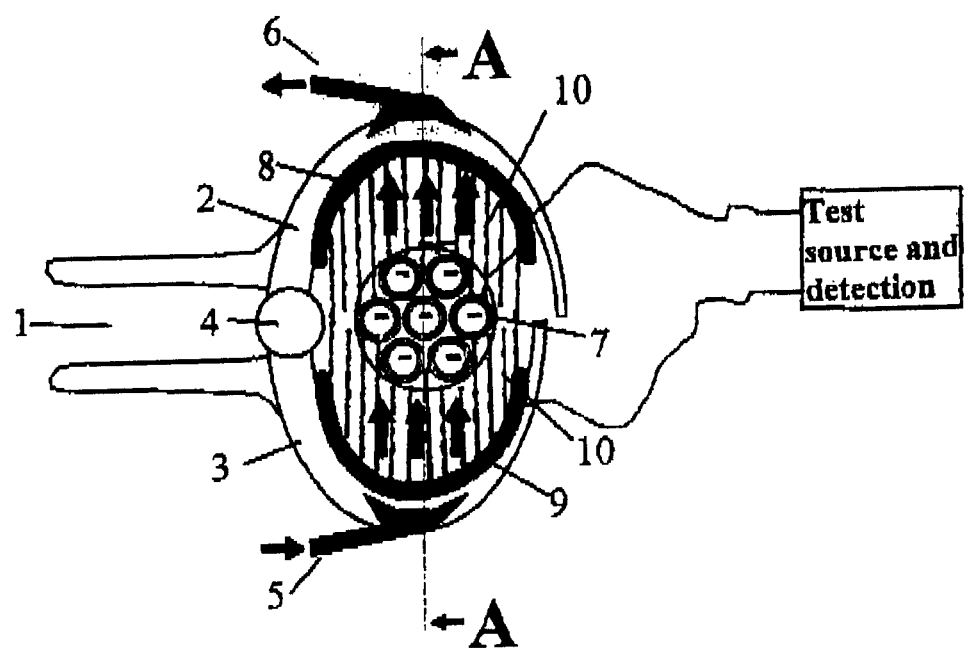
FIG. 1 in accordance with the invention, a mobile test device according to the type of a test pliers in a cross-sectional view FIG. 2 the test device according to FIG. 1 in sectioned side view FIG. 3 a known test device during the testing of a detectable insulation fault FIG. 4 the test device according to FIG. 3 with a non-detectable insulation fault FIG. 5 according to the invention, a stationary test device shown in principle arrangement FIG. 6 the testing of a cable harness within an aircraft fuselage FIG. 7 the testing of cable harnesses laid in an aircraft's wings, e.g., for the power supply of the level monitoring of individual fuel tanks, and FIG. 8 the testing of sensors, sensitive to overvoltage, in a fuel tank, e.g., for the measurement of the fuel supply.
Figure 2:
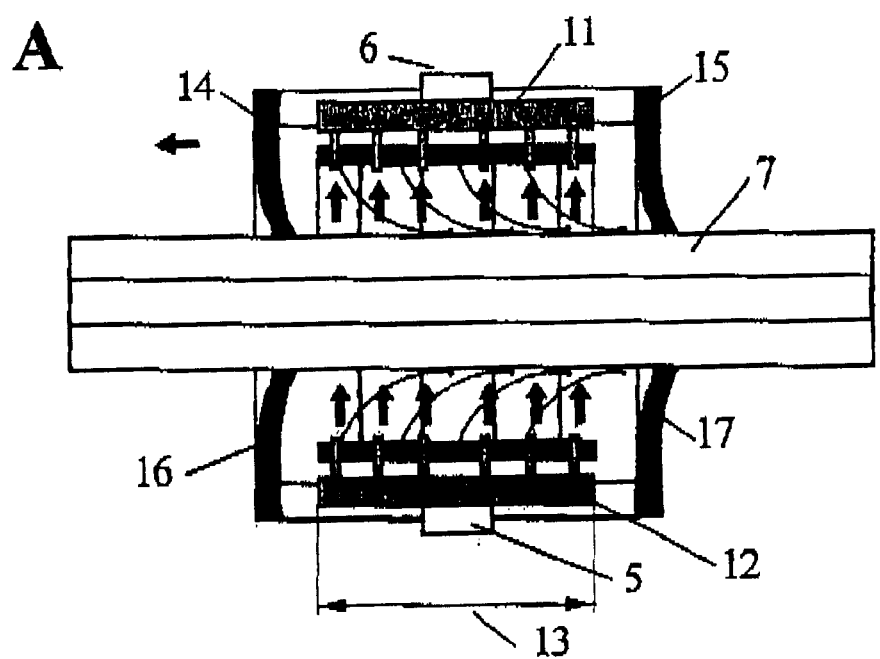

The test gas, helium for example, is distributed within the casing of the test pliers 1 by the gas distributors 11, 12, as shown in FIG. 2. The gas distributors 11, 12 and the lamellas 10 form the area of a test zone 13. The face sides of the casing flanks 2, 3 are provided with seals 14 to 17 which touch down on the cable harness 7, thus creating a relatively sealed-off test zone. The test gas is maintained at a certain overpressure, also because of the fact that gas losses in such an arrangement cannot be completely avoided.

After filling with test gas, the test pliers 1 is led in steps or continually along the cable harness 7. When proceeding stepwise, the test voltage must be increased anew in each increment.

Figures 3, 4:
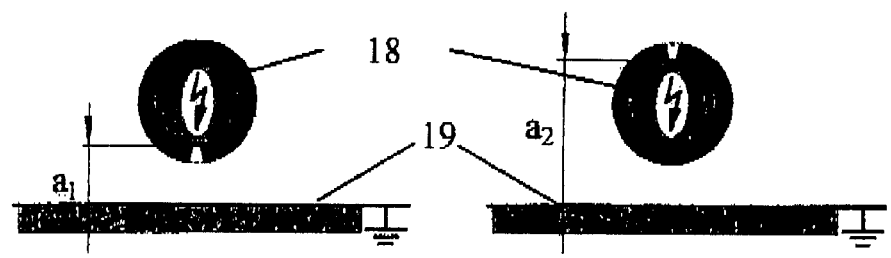

FIG. 3 shows, by contrast, a known arrangement. The conductors 18 form an electrode. At the distance $a_1$ a counter-electrode 19 is arranged. If there is a fault location, not as in FIG. 3 opposite the electrode 19, but has a greater distance $a_2$ as shown in FIG. 4, it is possible that the fault may not be detected at all. With the use of a test gas having a reduced disruptive discharge voltage compared with air, it is therefore ensured that such faults also are detected because of the earlier inception pre-discharges and/or discharges.

Figure 5:
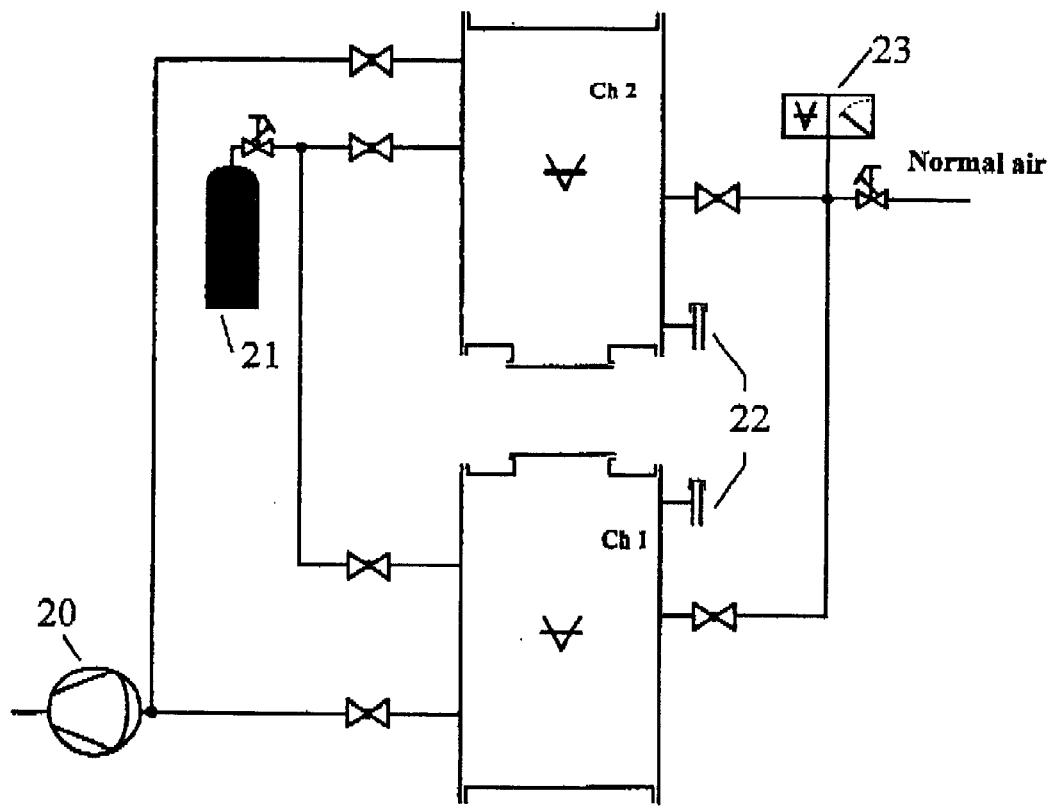

FIG. 5 shows the principle of a stationary arrangement for carrying out the process. The test objects are placed into a test chamber Ch1 or Ch2. The test chambers Ch1, Ch2 can be evacuated with a vacuum pump 20 and then filled with a test gas from a supply vessel 21.

By way of the lead-ins 22, a test voltage can be supplied to the test chambers Ch1, Ch2. With a pressure gauge 23, the pressure is checked in the test chambers Ch1, Ch2.

The internal walls of the test chambers Ch1, Ch2 can be at least partially provided with fibres or lamellas (not shown here), these being conductive, flexible, forming an electrode, at least partially covering the line or the cable harness 7, so that a cable harness can be placed for detection, e.g. easily into an "electrode bed" of a test chamber Ch1, Ch2, without having to apply any electrodes.

The test chambers Ch1, Ch2 are put alternatingly into operation, where one test chamber Ch1, Ch2 after evacuation with the test gas is filled from the other test chamber Ch2, Ch1. Gas losses are minimised in this way.

The test process can be observed by looking into the test chambers Ch1, Ch2 through an acryl glass disk.

Aircraft fuselages are, basically, already hermetically sealable. Therefore, no additional enclosure is required in this case, as shown in the principle arrangement according to FIG. 6. In any event, they are also provided with inlets and outlets for the venting purposes.

Figure 6:
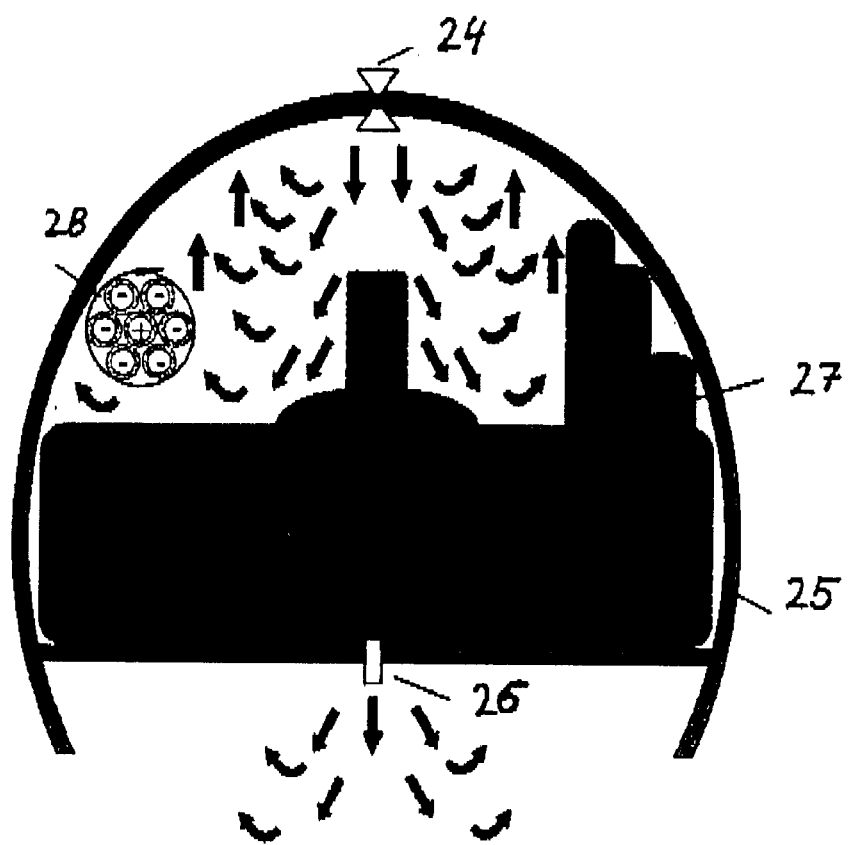

In FIG. 6 an air inlet 24 in an aircraft fuselage 25 is indicated where it is used as a test gas inlet. Through an air outlet 26 in the cabin floor, the air can escape when the aircraft fuselage 25 is filled with the test gas. In order to maintain a low volume for the test gas, displacement bodies 27 in the form of inflatable balloons were located beforehand in the interior space of the aircraft fuselage 25.

In the example shown here the test object, a cable harness 28, is tested by applying a test voltage between a conductor of an internal line and the conductors of external lines. With the use of a test gas having a reduced disruptive discharge voltage opposite air, it is now ensured that also such insulation faults, which are otherwise difficult to detect, can now be detected due to the earlier inception pre-discharges and/or discharges.

The test gas which has been conducted through the test device during the test with a minor overpressure can be collected in a vessel (not shown here) and, if required, led back to the test cycle again.

Figure 7:
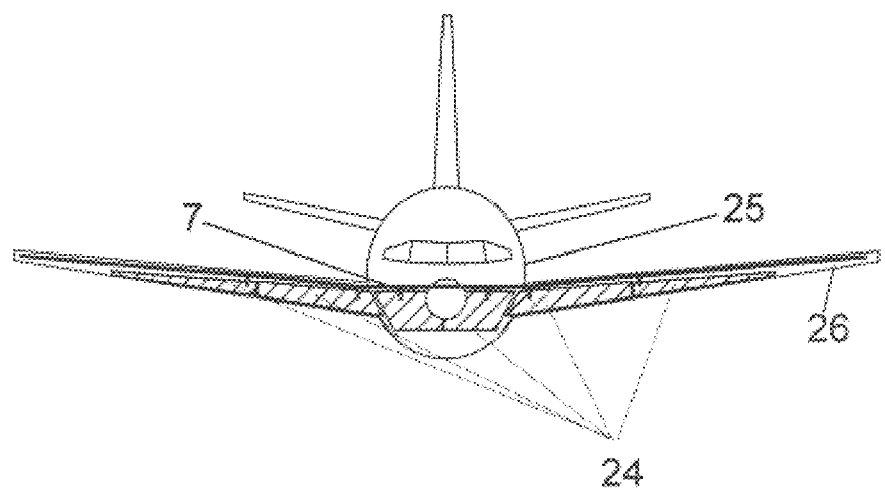

In FIG. 7 the principle arrangement of fuel tanks mounted in a wide-bodied aircraft is shown. The fuel tanks 24 can be regarded as an hermetically sealed-off system as they are located not only in the aircraft fuselage 25 but also in the wings 26. In the wings 26, the cable harnesses 7 are laid, e.g., for the power supply of the filling level monitoring of the individual fuel tanks 24. The aircraft fuselage 25 is hermetically sealed off. The wings 26 can, if required, be additionally located in an hermetic enclosure, e.g., in a sealable foil enclosure.

Figure 8:
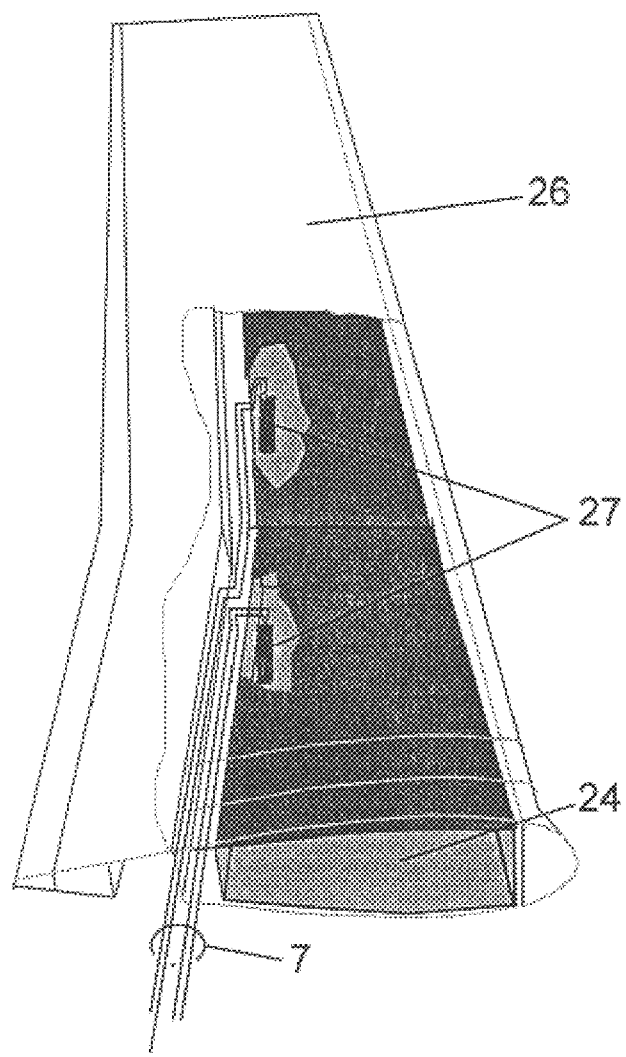

In FIG. 8, the schematic arrangement of an aircraft wing is shown. By putting in test gas into the fuel tank 24, a "critical atmosphere" with reduced disruptive discharge voltage is produced. In this way, the voltage endurance of electrical components installed in the fuel tank 24, e.g., fuel sensors 27, can be tested, and in a further test step the cable harness 7 laid in the wing 26 for the transmission of electrical signals can be tested by the introduction of the test gas.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for detecting damage in insulation of at least one of lines and cable harnesses, comprising the steps of:
   applying a voltage between at least one supply lead of an electrical structural element of a conductor of a line and an external counter-electrode or a further conductor of at least one of the structural element and the cable harness;
   detecting pre-discharges or discharges by at least one of electrically, optically, acoustically and chemically;
   creating a test vessel with a test enclosure surrounding an area of the line or cable harness to be inspected;
   sealing off the test enclosure before detection of discharge; and
   at least partially substituting an internal atmosphere of the test enclosure with a test gas or test gas mixture having a lower disruptive discharge voltage than that of air.

2. The method according to claim 1, wherein an inert gas is applied as a test gas.

3. The method according to claim 1, wherein the air in the test enclosure is purged by the test gas.

4. The method according to claim 1, wherein the test enclosure is evacuated before filling with the test gas.

5. The method according to claim 1, wherein the electrical component for detection is placed into an hermetically sealable test chamber.

6. The method according to claim 1, wherein the zone of a line or a cable harness to be detected is contained in a holding device having a test vessel forming a test enclosure.

7. The method according to claim 6, further comprising the step of testing the line or the cable harness in incremental movements of the test vessel, wherein the test voltage at each step is increased up to a pre-specified maximum or a fault detection.

8. The method according to claim 6, wherein the test vessel is moved continually along the line or the cable harness at a constant test voltage.

9. The method according to claim 1, wherein an external enclosure forms a test vessel around an electrical component, or a hermetically sealed object.

10. The method according to claim 9, wherein the internal space of the test object is at least partially filled with a displacement body.

11. A partial discharge detecting device for detection of damage in insulation in at least one of lines and cable harnesses, comprising;
- at least one hermetically sealed test chamber surrounding an area of the line or cable harness to be inspected, the test chamber being sealed off before detection of discharge, a voltage being applied to at least one supply lead of an electrical structural element or a conductor of the line and an external counter-electrode or a further conductor of at least one of the structural element and the cable harness;
- an outlet provided on said at least one test chamber;
- a vacuum pump connected to said outlet;
- an air and test gas inlet provided on said test chamber whereby an internal atmosphere of the test chamber is at least partially substituted by a test gas or test gas mixture having a lower disruptive discharge voltage than that of air; and
- a test voltage lead-in provided on said test chamber whereby pre-discharges or discharges are at least one of electrically, optically, acoustically and chemically dectatable.

12. The partial discharge detecting device according to claim 11, wherein;
- the internal walls of the test chamber are at least partially provided with conductive, flexible, and electrode-forming fibers or lamellas; and
- the internal walls at least partially cover a line or a cable harness.

13. A partial discharge detecting device for detection of damage in insulation of at least one of lines and cable harnesses, comprising:
- a test enclosure composed of two sealing connectable casing components which surround an area of the line or cable harness to be inspected, the test enclosure being sealed off before detection of discharge, said casing components at least partially covering the line or the cable harness in between each casing, and wherein pre-discharges or discharges within the test enclosure are at least one of electrically, optically, acoustically and chemically detectable;
- seals connected to a face side of the casing components, wherein said seals engage the line or the cable harness;
- a gas inlet and an outlet provided on said casing components whereby an internal atmosphere of the test enclosure is at least partially substituted by a test gas or test gas mixture having a lower disruptive discharge voltage than that of air; and
- an electrode provided on internal walls of the casing components whereby a voltage is applied to at least one supply lead of an electrical structural element or a conductor of the line and an external counter-electrode or a further conductor of at least one of the structural element and the cable harness.

14. The partial discharge detecting device according to claim 13, wherein the casing components are connected to each other via a hinge.

15. The partial discharge detecting device according to claim 14, wherein the inside portion of the casing components further comprise;
- electrodes on the internal walls of the casing components;
- conductive and flexible lamellas connected to the electrodes;
- said conductive and flexible lamellas engaging the line or the cable harness;
- said electrodes electrically connecting the conductive and flexible lamellas to the line or the cable harness.

16. The partial discharge detecting device according to claim 13 wherein the casing components further comprise;
- a gas distributor located on the inside of at least one of the casing components; and
- at least one of a gas inlet or gas outlet connected to said gas distributor.

* * * * *

UNITED STATES PATENT AND TRADEMARK OFFICE
CERTIFICATE OF CORRECTION

PATENT NO.    : 6,518,772 B1                                              Page 1 of 1
DATED         : February 11, 2003
INVENTOR(S)   : Milkovic, Nikola and Hanson, Josef It is certified that error appears in the above-identified patent and that said Letters Patent is hereby corrected as shown below:

<u>Title page,</u>
Please add the following section:

-- [30]    Foreign Application Priority Data

May 16, 2000     [DE]     Germany      100 24 809.8 --

Signed and Sealed this

Sixteenth Day of September, 2003

JAMES E. ROGAN
*Director of the United States Patent and Trademark Office*